United States Patent [19]
Cohen et al.

[11] Patent Number: 5,339,217
[45] Date of Patent: Aug. 16, 1994

[54] COMPOSITE PRINTED CIRCUIT BOARD AND MANUFACTURING METHOD THEREOF

[75] Inventors: Isaac Cohen, Dix Hills; William Svoronos, Hauppauge, both of N.Y.

[73] Assignee: Lambda Electronics, Inc., Melville, N.Y.

[21] Appl. No.: 50,508

[22] Filed: Apr. 20, 1993

[51] Int. Cl.⁵ .............................................. H05K 7/20
[52] U.S. Cl. ............................. 361/707; 174/252; 428/209; 428/901
[58] Field of Search .................... 174/16.3, 252; 361/386–389, 397, 398, 412, 414; 428/209, 901

[56] References Cited
U.S. PATENT DOCUMENTS

| | | | |
|---|---|---|---|
| 3,912,849 | 10/1975 | Thomas | 174/252 |
| 4,810,563 | 3/1989 | DeGree et al. | |
| 4,922,378 | 5/1990 | Malhi et al. | 361/387 |
| 5,055,967 | 10/1991 | Sukonnik et al. | 361/387 |
| 5,220,487 | 6/1993 | Patel et al. | 361/388 |

*Primary Examiner*—Gregory D. Thompson
*Attorney, Agent, or Firm*—Morgan & Finnegan

[57] ABSTRACT

A composite printed circuit board includes a metal substrate printed circuit section and an insulation substrate printed circuit board section. The metal substrate printed circuit section includes a first layer of a thermally conductive metal for providing high thermal conductivity, and a second layer made of a thermally conductive and electrically insulative material disposed adjacently to said first layer. The second layer has an upper surface upon which electrically conductive wiring may be disposed. The insulator substrate printed circuit board section forms an integral surface with the metal substrate printed circuit section. The insulator substrate printed circuit section further includes a first layer of insulative material, and a second layer of a metallic foil disposed adjacently to at least one side of said first layer of insulative material for forming a conductive wiring layout.

18 Claims, 3 Drawing Sheets

COMPOSITE PRINTED CIRCUIT BOARD AND MANUFACTURING METHOD THEREOF

FIELD OF THE INVENTION

This invention relates to circuit boards and more specifically to a printed circuit board having high thermal performance.

BACKGROUND OF THE INVENTION

Printed circuit boards consisting of a pattern of wiring on an insulating base or substrate, have become the standard method of construction of practically all electronic systems.

One method of producing printed circuit boards includes a subtractive process wherein a metal foil, usually copper, is bonded to an insulating substrate and then etched to form a required pattern. Another method of producing printed circuit boards includes an additive process wherein metal deposition is used to make the pattern on the surface of an insulating substrate.

The printed circuit boards made by the above-mentioned methods may have conductors on one side of the insulating substrate, commonly known as single-sided, or may have conductors on both sides of the insulating substrate, commonly known as double-sided. In addition, a number of the printed circuit boards made by the above-mentioned method may be stacked and bonded together to form a multiple-layered board. Although these printed circuit boards provide the means for creating complex interconnecting patterns, they lack the capability to effectively extract the heat generated by power devices installed on their surface.

One of the important design considerations in utilizing printed circuit boards in electronic packaging is removal of heat generated by high power dissipating devices which are mounted on the board. Conventional heat removal structures include a strip of metal connected to the printed circuit board as a heat sink layer. The high power device would then be disposed on the heat sink layer and their leads connected to the printed circuit board. A major disadvantage of such heat sink layers is that the total package including the printed circuit board and the heat sink becomes inefficiently large and heavy with low average component density per unit area.

A recent method for providing printed circuits with high thermal performance utilizing a metal substrate printed circuit board is disclosed in U.S. Pat. No. 4,810,563 issued Mar. 7, 1989 to DeGree et. al.

The thermally conductive circuit board is built by laminating a thin layer of high performance insulator on top of a metal substrate and bonding a thin conductive metal layer on the insulator. The conductive layer may be etched to form a desired circuit pattern thus resulting effectively in a printed circuit board.

Successive layers of insulation and conductors can be added to form a multilayered board. The metal substrate of the board may be mounted on a heat sink. Consequently, heat can be removed very efficiently from devices mounted on the printed circuit board.

There are several disadvantages associated with metal substrate printed boards. For instance, the cost of processing the board with a metal substrate layer and an insulation layer is higher than the cost of processing a conventional, insulator based, printed circuit board. Furthermore, electrical components cannot be installed on both sides of the metal substrate, printed circuit boards as opposed to conventional printed circuit boards with double-sided capability. Another disadvantage is that only surface-mounted components can be used in conjunction with metal substrate, printed circuit boards; since through hole mounting of components is impossible. Furthermore, operation of circuits assembled on such a board may be impaired due to the presence of large stray capacitances.

OBJECTS OF THE INVENTION

It is therefore an object of the present invention to overcome the above deficiencies and provide a printed circuit board with high thermal conductivity and high component density.

SUMMARY OF THE INVENTION

According to the present invention, the foregoing and other objects are attained by a composite printed circuit board which contains one section of metal substrate printed circuit board and another section of an insulator substrate printed circuit board.

The metal substrate printed circuit section contains a first layer of a thermally conductive metal for providing high thermal conductivity. Disposed on the first layer is at least a second layer made of a thermally conductive and electrically insulative material. The upper surface of the second layer provides a base for electrically conductive wiring and high power dissipative devices.

The insulator substrate printed circuit section forms an integral mounting surface with the metal substrate printed circuit section for mounting electrical components. The insulator substrate printed circuit section includes a first layer of insulative material and a second layer of a metallic foil for forming a conductive wiring layout.

According to one embodiment of the invention, depressions may be formed on appropriate points on the periphery of the metal substrate, printed circuit board. The depression is equal in depth with the thickness of the insulator substrate printed circuit board it is to be joined with. This allows the formation of a continuous mounting surface over the metal and substrate-based printed circuit boards.

According to an object of the invention the two or more sections may be joined by any conventional fastener, including rivets or cements and the resulting structure may have any arbitrary shape.

DETAILED DESCRIPTION OF THE DRAWINGS

Figures 1, 2:
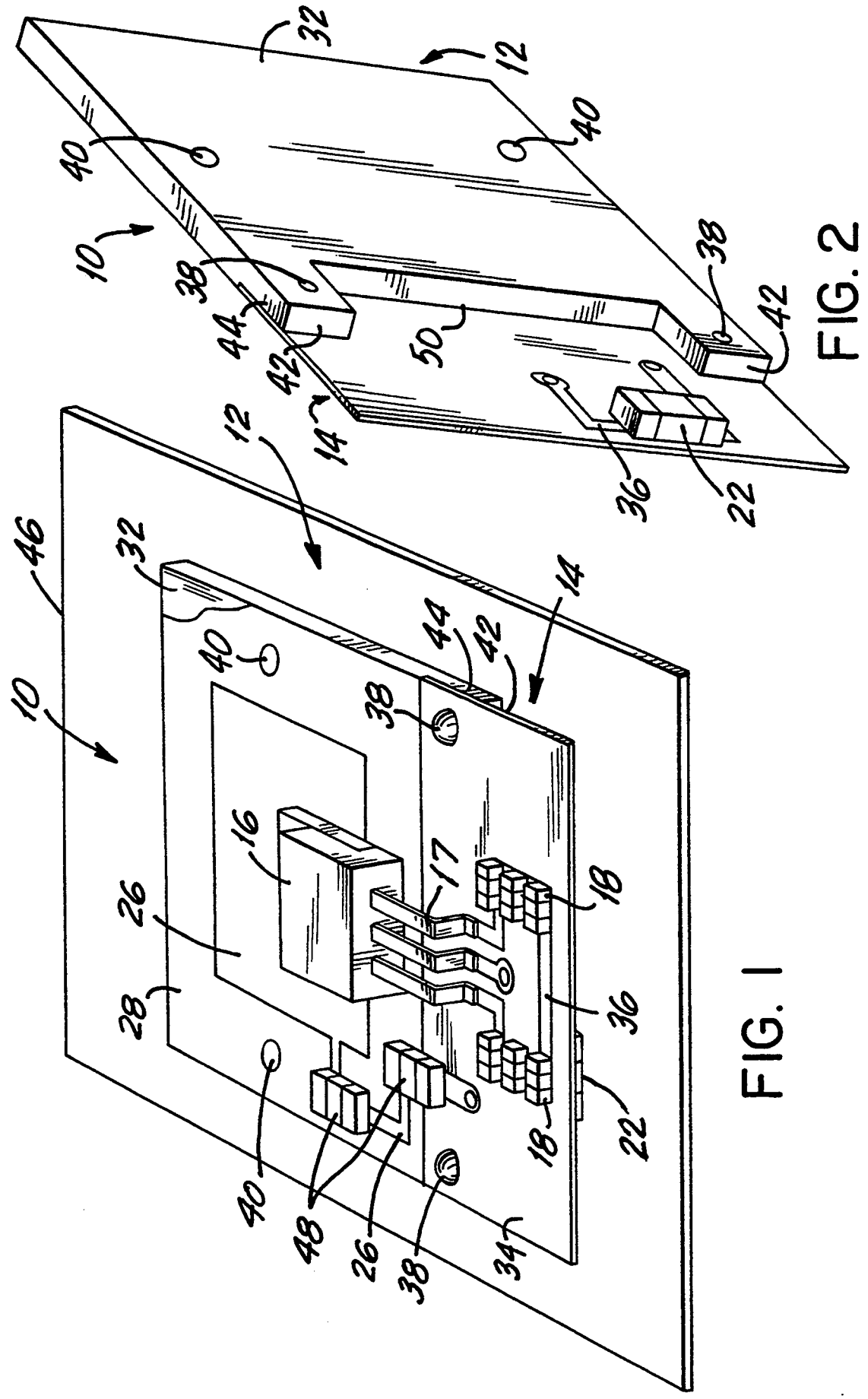
FIG. 1 illustrates a composite printed circuit board according to the present invention.
FIG. 2 illustrates a bottom view of the composite printed circuit board illustrated in FIG. 1.

FIG. 1 illustrates a composite printed circuit board 10 according to the present invention. The circuit board 10 may include a section made of insulator substrate printed circuit board 14, and another section made of metal substrate printed circuit board 12.

The insulator substrate printed circuit board 14 includes a laminate 34 and a circuitry configuration 36 formed from a copper-foil clad. Laminate 34 may be composed of layers of material pressed together under heat and pressure to form a dense consistent electrical insulator. The basic raw material of laminate 34 may illustratively consist of paper, glass, cloth or glass mat boarded together with various resins like phenolic or epoxy. Conventional forming techniques for preparing the appropriate wiring lay out configuration like the etched foil process may be utilized to form the wiring pattern. The etched foil process is a subtractive process by which the excess metal of copper-foil blend is selectively removed, by etching, to leave the desired circuitry configuration 36. In general, copper-foil clad is first coated in the desired conductor configuration with a protective resist material. The copper not protected by the resist is then chemically removed by an etching process to form the circuitry configuration 36.

As illustrated in FIG. 1 the layout of printed circuit board 14 may include components 18 disposed on one side of the printed circuit board. Furthermore, more components such as component 22 may also be disposed on the other side of the printed circuit board.

FIG. 1 also illustrates a metal substrate printed circuit board section 12. Printed circuit board 12 has very high thermal conductivity. Typically, printed circuit board 12 provides a mounting support and heat conduction for high power semiconductor device 16, and is in turn connected to a thermally conductive surface using mounting holes 40. As noted previously, the section of the composite circuit board 10, made of metal substrate printed circuit board 12 as illustrated in FIG. 1 is described in U.S. Pat. No. 4,810,563, incorporated herein by reference. Generally, the metal substrate printed circuit board 12 includes metallic outer layer 32 and a metallic conductive circuitry configuration 26 formed from a metallic layer by a conventional forming technique like etch back processing. As mentioned before, such processing may include coating the desired circuit configuration with a protective resist material and chemically removing by an etching process the metallic portions not protected by the resist. Sandwiched between the metallic outer layer 32 and circuit configuration 26, is a thin electrically insulating layer 28. Film layer 28 is preferably made of thermally conductive, electrically insulating material. For example, film layer 28 may be made of a particulate solid laden epoxy film. Furthermore, metallic outer layer 32 is preferably made of a copper or aluminum pad, and metallic circuit configuration 26 is preferably made of copper.

Thus, high power semiconductor device 16 is mounted on circuitry configuration 26 for thermal conduction. The heat generated by device 16 is conducted to circuitry configuration 26 and through insulating film layer 28 is conducted to the metal substrate comprising metallic outer layer 32. The heat can now be easily dissipated by either conduction or convection.

As illustrated in FIG. 1, the metal substrate printed circuit board 12 is processed on one side to form an edge 44 and a side wall 42. Thereafter insulator substrate printed circuit board 14 is coupled to circuit board 12, for example, by the way of a lap-joint technique. The two printed circuit boards 12 and 14 are connected, by rivets 38 such that their individual top planes form an integral smooth top plane. The resulting surface allows components mounted thereon such as power device 16 and components 48 to be connected to both sections of board 10, thereby seamlessly combining the electrical elements mounted on the two board sections into a consolidated electrical circuit. Thus, terminals 17 of power device 16 may be extended from board 12 to board 14 and be connected to conductor pattern 36 of board 14. Similarly, component 48 may be mounted on board 10 such that part of it is on board 12 and part of it is on board 14. Furthermore, components 48 and 16 and 18 may be electrically interconnected. The bottom plane (i.e., metallic outer layer 32) of metal substrate printed circuit board 12 may be connected to a chassis or metallic frame 46 in such a way as to form a good thermal bond. However, the bottom plane of insulator substrate circuit board 14 does not contact the chassis or metallic frame, and enough clearance may be made to allow mounting of components 22 to the bottom surface of board 14.

Figure 3:
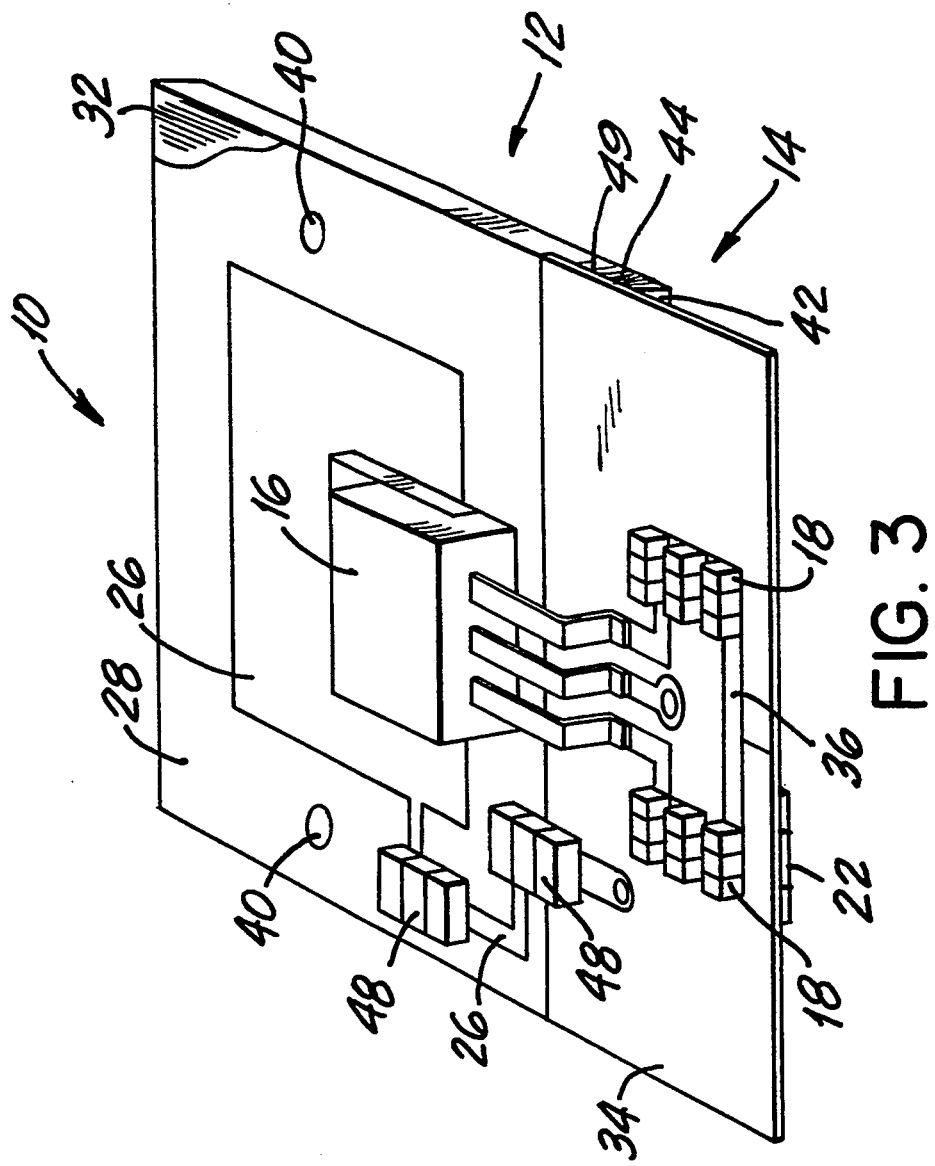
FIG. 3 illustrates a composite printed circuit board according to an embodiment of the present invention.

The edge 44 and side wall 42 may be formed by compressing the metal substrate printed circuit board 12 on its connecting portion to reduce its thickness. It will be appreciated by those skilled in the art that the two printed circuit boards may be joined by alternative means like cement 49 (FIG. 3) or screws.

FIG. 2 illustrates the bottom view of composite printed circuit board 10 of the present invention as illustrated in FIG. 1. Circuitry configuration 36 forms the printed wiring layout of printed circuit board 14. Metal outer layer 32 is coupled to printed circuit board 14 by rivets 38. In order to minimize the interface area between the metal substrate printed circuit board 12 and insulator substrate printed circuit board 14, side wall 42 of FIG. 1 may be cutout in its intermediate portion such that edge 44 extends outwardly from metal layer 32 around rivets 38 more than the portions remaining along the intermediate section 50 located between the two rivets.

Figure 4:
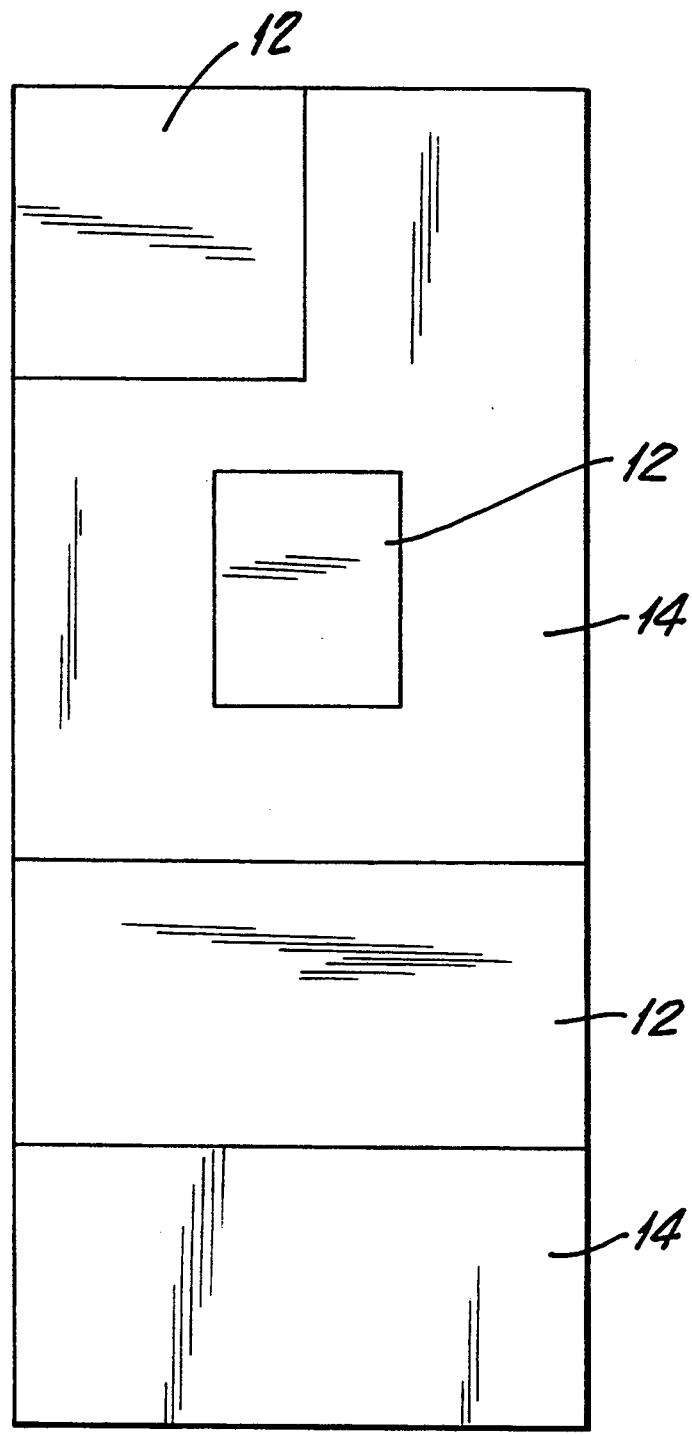
FIG. 4 schematically illustrates a composite printed circuit board including a plurality of insulator substrate and metal substrate printed circuit boards, in accordance with the present invention.

It will be appreciated by those skilled in the art that the composite printed circuit board according to the present invention offers high density properties on portions formed by insulator substrate printed circuit board and very high thermal conductivity on its portions formed by metal substrate printed circuit board. It would also be appreciated that the two types of the boards may be integrated in many different forms and shapes. For example, in a conventional insulator substrate printed circuit section an island may be formed made of the metal substrate printed circuit section upon which a heat generating device is mounted. Such an embodiment is schematically illustrated in FIG. 4 which shows a composite printed circuit board including a plurality of insulator substrate printed circuit boards 14 and a plurality of metal substrate printed circuit boards 12.

The metal substrate printed circuit section may conduct the heat generated by the high power devices which are disposed on it through the substrate and to the chassis, and yet it allows for wiring configuration such that wiring layout of a composite printed circuit board is not interrupted.

We claim:
1. A composite printed circuit board comprising:
a metal substrate printed circuit section having,
   a first layer of a thermally conductive metal for providing high thermal conductivity,
   a second layer made of a thermally conductive and electrically insulative material disposed adjacently to said first layer, said second layer having an upper surface upon which electrically conductive wiring may be disposed; and an insulator substrate printed circuit board section forming an integral mounting surface with said metal substrate printed circuit section, said insulator substrate printed circuit section further comprising, a first layer of insulative material, and a second layer of a metallic foil disposed adjacently to at least one side of said first layer of insulative material for forming a conductive wiring layout.

2. The invention as claimed in claim 1 wherein said metal substrate printed circuit section is disposed on a metallic frame for conducting the heat generated on said upper surface through said metal substrate printed circuit section to said metallic frame.

3. The invention as claimed in claim 2 wherein said insulator substrate printed circuit section and said metal substrate printed circuit section are positioned adjacently by a lap-joint technique.

4. The invention as claimed in claim 3 wherein the portion of the metal substrate section positioned adjacently to the insulator substrate section includes an edge and a side wall.

5. The invention as claimed in claim 4 wherein said edge and said side wall are formed by machining said portion of the metal substrate section positioned adjacently to insulator substrate section.

6. The invention as claimed in claim 4 wherein said edge and said side wall are formed by compressing said portion of the metal substrate section positioned adjacently to the insulator substrate section.

7. The invention as claimed in claim 6 wherein said metal substrate section and said insulator substrate section are connected by a fastener.

8. The invention as claimed in claim 6 wherein said metal substrate section and said insulator substrate section are connected by cement.

9. The invention as claimed in claim 7 wherein along said side wall of said metal substrate printed circuit section adjacent to said insulator substrate printed circuit section, portions of said metal substrate printed circuit section surrounding said fasteners extend more outwardly than the intermediate portion along said side wall of said metal substrate printed circuit section.

10. The invention as claimed in claim 1, wherein a plurality of said metal substrate printed circuit sections and said insulation substrate printed circuit sections are joined together to form an integral surface.

11. The invention as claimed in claim 1, wherein electrical components are disposed on both said metal substrate printed circuit section and on said insulator substrate printed board section, said electrical components being electrically interconnected.

12. A method for manufacturing a composite circuit board comprising the steps of:

forming a metal substrate printed circuit section having a metal base layer and an insulator upper layer disposed on said metal base layer, said insulator upper layer having a top surface upon which electrically conductive wiring may be disposed;

connecting an insulator substrate circuit section with said metal substrate printed circuit section to form an integral mounting surface, said insulator substrate printed circuit section having a first layer of insulative material and a second layer of a metallic foil for forming a conductive wiring layout.

13. The method as claimed in claim 12 further comprising the step of disposing said metal substrate printed circuit section on a metallic frame for conducting the heat generated on said upper surface through said metal substrate printed circuit section to said metallic frame.

14. The method as claimed in claim 13 wherein said step of forming a metal substrate circuit section further comprise the step of machining a portion of the metal substrate circuit portion positioned adjacently to the insulation substrate circuit portion positioned adjacently to the insulation substrate circuit section for forming an edge and a side wall.

15. The method as claimed in claim 13 wherein said step of forming a metal substrate circuit section further comprises the step of compressing a portion of the metal substrate circuit portion positioned adjacently to the insulator substrate circuit section for forming an edge and a side wall.

16. The method as claimed in claim 15 wherein said step of connecting further comprise the step of positioning said insulator substrate circuit section and said metal substrate circuit section along said edge and side wall adjacently by a lap joint technique.

17. The method as claimed in claim 16 wherein said step of connecting further comprise the step of attaching said metal substrate circuit section and said insulator substrate circuit section by rivets.

18. The method as claimed in claim 16 wherein said step of connecting further comprise the step of attaching said metal substrate circuit section and said insulator substrate circuit section by cement.

* * * * *